(12) United States Patent
Yabuuchi

(10) Patent No.: US 10,600,483 B2
(45) Date of Patent: Mar. 24, 2020

(54) TERNARY CONTENT ADDRESSABLE MEMORY WITH MATCH LINE CIRCUIT FOR CONTROLLING POTENTIAL OF MATCH REALIZING HIGHER SPEED OF SEARCH ACCESS

(71) Applicant: Renesas Electronics Corporation, Tokyo (JP)

(72) Inventor: Makoto Yabuuchi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/926,863

(22) Filed: Mar. 20, 2018

(65) Prior Publication Data

US 2018/0350438 A1 Dec. 6, 2018

(30) Foreign Application Priority Data

May 30, 2017 (JP) ................................. 2017-106507

(51) Int. Cl.
*G11C 15/04* (2006.01)
*G11C 8/08* (2006.01)
*G11C 11/412* (2006.01)
*G11C 16/12* (2006.01)
*G11C 8/14* (2006.01)

(52) U.S. Cl.
CPC ............... *G11C 15/04* (2013.01); *G11C 8/08* (2013.01); *G11C 8/14* (2013.01); *G11C 11/412* (2013.01); *G11C 16/12* (2013.01)

(58) Field of Classification Search
CPC .................................. G11C 15/04; G11C 8/08
See application file for complete search history.

(56) References Cited

U.S. PATENT DOCUMENTS

| 6,515,884 B1 * | 2/2003 | Sywyk | G11C 15/04 365/203 |
| 8,947,901 B2 * | 2/2015 | Kishida | G11C 15/04 365/49.17 |
| 2007/0247885 A1 * | 10/2007 | Watanabe | G11C 15/04 365/49.17 |
| 2011/0216569 A1 * | 9/2011 | Akiyama | G11C 15/00 365/49.17 |
| 2013/0242632 A1 * | 9/2013 | Wada | G11C 15/02 365/49.17 |

(Continued)

FOREIGN PATENT DOCUMENTS

JP  2017-045495 A  3/2017

OTHER PUBLICATIONS

European Search Report dated Oct. 22, 2018 for European Patent Application No. 18174603.3-1203.

*Primary Examiner* — Mushfique Siddique
(74) *Attorney, Agent, or Firm* — McDermott Will & Emery LLP

(57) ABSTRACT

An object of the present disclosure is to provide a content addressable memory realizing higher speed of a search access. A content addressable memory includes: a plurality of memory cells; a match line coupled to the plurality of memory cells; a search line coupled to each of the plurality of memory cells; a match line output circuit coupled to the match line; and a potential changing circuit coupled to the match line and changing the potential of the match line.

19 Claims, 13 Drawing Sheets

(56) References Cited

U.S. PATENT DOCUMENTS

| | | | |
|---|---|---|---|
| 2013/0258739 A1* | 10/2013 | Kishida | G11C 15/04 365/49.17 |
| 2015/0179261 A1* | 6/2015 | Arsovski | G11C 15/04 365/49.17 |
| 2015/0348628 A1* | 12/2015 | Matsuoka | G11C 15/04 365/49.17 |
| 2017/0062051 A1 | 3/2017 | Watanabe et al. | |

* cited by examiner

| SRAM CELL (X CELL) | SRAM CELL (Y CELL) | TCAM CELL DATA |
|---|---|---|
| "1" | "0" | "0" |
| "0" | "1" | "1" |
| "0" | "0" | "x" (don't care) |
| "1" | "1" | NON-USE |

FinFET (c) DL1

TERNARY CONTENT ADDRESSABLE MEMORY WITH MATCH LINE CIRCUIT FOR CONTROLLING POTENTIAL OF MATCH REALIZING HIGHER SPEED OF SEARCH ACCESS

CROSS-REFERENCE TO RELATED APPLICATIONS

The disclosure of Japanese Patent Application No. 2017-106507 filed on May 30, 2017 including the specification, drawings and abstract is incorporated herein by reference in its entirety.

BACKGROUND

The present disclosure relates to a content addressable memory and is particularly applicable to the content addressable memory which is able to be built in a semiconductor device and the semiconductor device in which the content addressable memory is built.

A storage device which is called an associative memory or a CAM (Content Addressable Memory) is adapted to search for a data word which matches a search word (search data) from among data words (entries) that the storage device stores therein and to output an address of the data word in a case where the data word which matches the search word is found.

There are a BCAM (Binary CAM) and a TCAM (Ternary CAM) in the CAM. Each memory cell of the BCAM stores information of either "0" or "1". On the other hand, each memory cell of the TCAM is able to store information of "don't care" in addition to the information of "0" and "1". "don't care" indicates that either "0" or "1" will do.

A TCAM device using a TCAM is widely used for address search and access control in a router for a network such as the Internet. It is expected that everything is coupled to a network such as IoT (Internet of Things). In IoT, demand for a TCAM is increasing like routing of a network. In a general TCM, however, the speed and the scale of a system increase, so it has come to be demanded to provide a TCAM device in a semiconductor chip as a system on a chip SoC.

Patent literature 1 (Japanese Unexamined Patent Application Publication No. 2017-45495) discloses an example of a TCAM device using a TCAM.

SUMMARY

In a CAM, it is very important to increase the speed of a search access. To a match line as a critical path of a search access, a plurality of memory cells including one entry is coupled. Consequently, the load capacity of the match line is relatively large, and it is not easy to increase the speed of a search access.

An object of the present disclosure is to provide a content addressable memory realizing higher speed of a search access.

The other objects and novel features will become apparent from the description of the specification and appended drawings.

Outline of a representative embodiment of the present disclosure will be briefly described as follows.

A content addressable memory includes: a plurality of memory cells; a match line coupled to the plurality of memory cells; a search line coupled to each of the plurality of memory cells; a match line output circuit coupled to the match line; and a potential changing circuit coupled to the match line and changing the potential of the match line.

The content addressable memory realizes higher speed of a search access.

DETAILED DESCRIPTION

First, a problem examined by the inventors of the present invention will be described.

Figure 1:
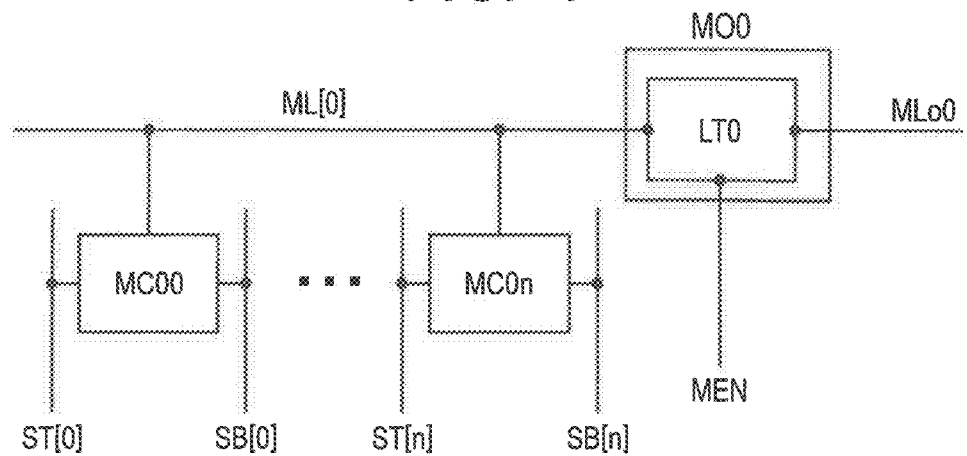
FIG. 1 is a diagram for explaining a search access of a content addressable memory.

FIG. 1 is a diagram for explaining a search access of a content addressable memory. As illustrated in FIG. 1, the content addressable memory includes a plurality of memory cells MC00 to MC0$n$, a match line ML[0] coupled to the plurality of memory cells MC00 to MC0$n$, a match line output circuit MO0 coupled to the match line ML[0], and a match signal output line MLo0 coupled to the match line output circuit MO0. The match line output circuit MO0 includes a latch circuit LT0. The input of the latch circuit LT0 is coupled to the match line ML[0], the output of the latch circuit LT0 is coupled to the match signal output line MLo0, and a match output enable signal MEN is supplied to a control terminal of the latch circuit LT0. When the latch output enable signal MEN is set to a selection level such as the high level, the latch circuit LT0 takes in the potential of the match line ML[0] and outputs the fetched potential to the match signal output line MLo0. The plurality of memory cells MC00 to MC0n is coupled to search line pairs ST[0], SB[0] to ST[n],SB[n].

When a search access is performed, whether a data word (entry) stored in the plurality of memory cells MC00 to MC0n matches a search word (search data) input from the search line pairs ST[0],SB[0] to ST[n],SB[n] or not is determined. In the case of a match, a pre-charge potential such as the high level in the match line ML [0] is maintained. In the case of a mismatch, the pre-charge potential such as the high level in the match line ML[0] changes to the low level such as the ground potential (GND, Vss). The potential level of the match line ML[0] changed to the low level is taken into the latch circuit LT0 and output to the match signal output line MLo0. The speed of the search access can be regarded as a speed since the search word (search data) is supplied until a signal is output to the match signal output line MLo0.

As understood from FIG. 1, a plurality of memory cells MC00 to MC0n including one entry is coupled to the match line ML[0], so that the load capacity of the match line ML[0] is relatively large. For example, when a data word (entry) and a search word (search data) are different from each other only by one bit, the load capacity of the match line ML [0] is discharged by one memory cell. Consequently, there is a problem that the speed of the search access becomes low.

There is also another problem. When only the memory cell MC00 arranged furthest from the match line output circuit MO0 does not match, the load capacity of the match line ML [0] is discharged by the memory cell MC00, so that the speed of the search access becomes the lowest.

The speed of the search access is influenced also by manufacture variations in the transistors of the plurality of memory cells MC00 to MC0n or manufacture variations in the transistors including a data comparing unit of the plurality of memory cells MC00 to MC0n. Although the load capacity of the match line ML [0] is discharged by the transistors including the data comparing unit of the memory cells MC00 to MC0n, due to the manufacture variations of the transistors including the data comparing unit of the memory cells MC00 to MC0n, the level such as the low level of the match line ML [0] itself changes.

Figure 2:
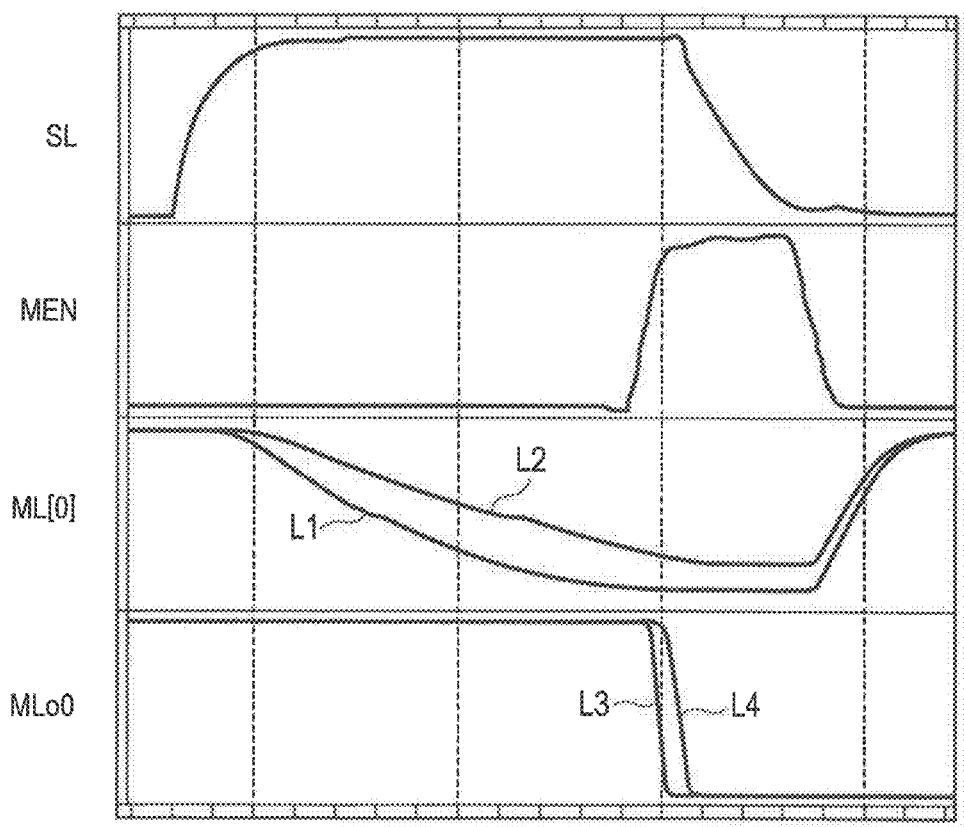
FIG. 2 is a diagram for explaining potential changes in a match line ML[0].

FIG. 2 is a diagram for explaining potential changes in the match line ML [0]. FIG. 2 illustrates simulation waveforms expressing potential changes of the match line ML [0] in the case of a mismatch. The vertical axis indicates voltage, and the horizontal axis indicates time. SL indicates the waveform of the search line pairs ST [0], SB [0] to ST [n], SB [n], and MEN indicates the waveform of the match output enable signal MEN. ML [0] indicates the waveform of the match line ML [0], and MLo0 indicates the waveform of the match signal output line MLo0.

In FIG. 2, when the waveform of SL changes from the low level to the high level, the search access starts. By the start, as illustrated by the waveform of ML [0], the level of the match line ML [0] gradually changes towards the low level. When the waveform of MEN changes from the low level to the high level, the level of the match line ML[0] at that time point is taken in the latch circuit LT0, and the match signal output line MLo0 changes from the high level to the low level as illustrated by the waveform of MLo0.

In the waveform of ML[0], waveforms L1 and L2 indicate changes in the potential of the low level of the match line ML[0] due to the influence of the above-described manufacture variations. The waveform L2 indicates the case of a manufacture variation more than the case of the waveform L1. The gradient of the change toward the low level side of the waveform L2 is gentler than that of the waveform L1, and the potential itself of the low level of the waveform L2 is higher than that of the waveform L1. In the waveform of MLo0, the waveform L3 indicates the potential change of the match signal output line MLo0 in the case of the waveform L1, and the waveform L4 indicates the potential change of the match signal output line MLo0 in the case of the waveform L2. As described above, there is a problem that the time of the potential change in the match signal output line MLo0 in the waveform L4 delays as compared with the waveform L3.

Hereinafter, an embodiment, an example, and an application example will be described with reference to the drawings. In the following description, the same reference numerals are designated to the same components and repetitive description may be omitted. To make the drawings described more clearly, in some cases, the width, thickness, shape, and the like of each of the components are expressed more schematically than those in an actual mode. Those are an example and do not limit the interpretation of the present invention.

Embodiment

Figure 3:
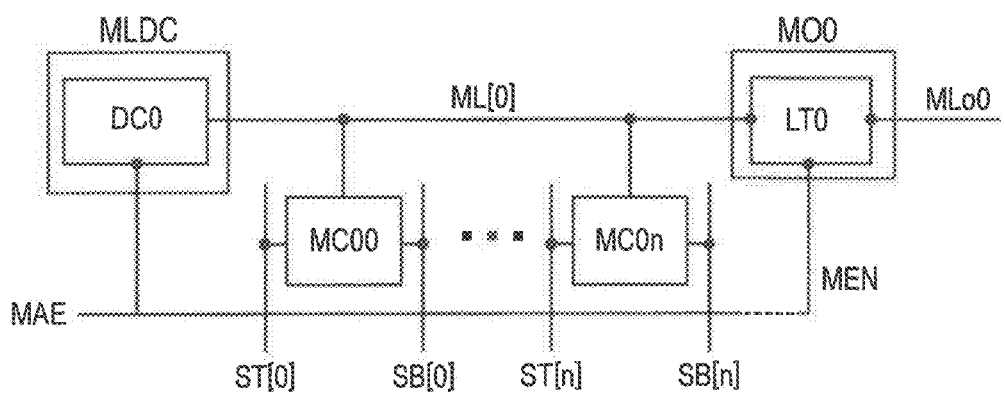
FIG. 3 is a diagram illustrating a configuration example of a content addressable memory according to an embodiment.

FIG. 3 is a diagram illustrating a configuration example of a content addressable memory according to an embodiment.

A content addressable memory 10 is provided, for example, in a semiconductor device. The content addressable memory 10 has a plurality of memory cells MC00 to MC0n, a match line ML [0] coupled to the plurality of memory cells MC00 to MC0n, a match line potential changing circuit unit MLDC coupled to the match line ML [0], a match line output circuit MO0 coupled to the match line ML [0], and a match signal output line MLo0 coupled to the match line output circuit MO0.

The match line potential changing circuit unit MLDC has a potential changing circuit DC0 for changing the potential of the match line ML [0]. The potential changing circuit DC0 is provided to discharge or draw the potential of the match line ML [0] in accordance with a selection level such as the high level of a first match output enable signal MAE. The potential changing circuit DC0 can be also mentioned as a match line drawing amplification circuit.

The match line potential changing circuit MLDC is coupled at one end side of the match line ML [0], and the match line output circuit MO0 is coupled to the other end side of the match line ML [0]. That is, the match line potential changing circuit MLDC and the match line output circuit MO0 are arranged over a semiconductor chip in which a semiconductor device is formed so as to sandwich the plurality of memory cells MC00 and MC0n coupled to the match line ML [0].

The match line output circuit MO0 includes a latch circuit LT0. The input of the latch circuit LT0 is coupled to the match line ML [0], the output of the latch circuit LT0 is coupled to the match signal output line MLo0, and a second match output enable signal MEN is supplied to the control terminal of the latch circuit LT0. When the match output enable signal MEN is set to a selection level such as the high level, the latch circuit LT0 takes in the potential of the match line ML [0] and outputs the taken potential to the match signal output line MLo0. The plurality of memory cells MC00 to MC0n is coupled to search line pairs ST [0], SB [0] to ST [n], SB [n]. The second match output enable signal MEN is a signal obtained by delaying the first match output enable signal MAE.

When a search access is performed, whether a data word (entry) stored in the plurality of memory cells MC00-MC0n matches a search word (search data) input from the search line pairs ST [0], SB [0] to ST [n], SB [n] or not is determined. In the case of a match, a pre-charge potential such as the high level in the match line ML [0] is maintained. In the case of a mismatch, the pre-charge potential such as the high level in the match line ML [0] changes to the low level such as the ground potential (GND, Vss). The potential changing circuit DC0 discharges or draws the potential of the match line ML [0] so as to increase the speed of the change to the low level of the match line ML [0].

Figure 4:
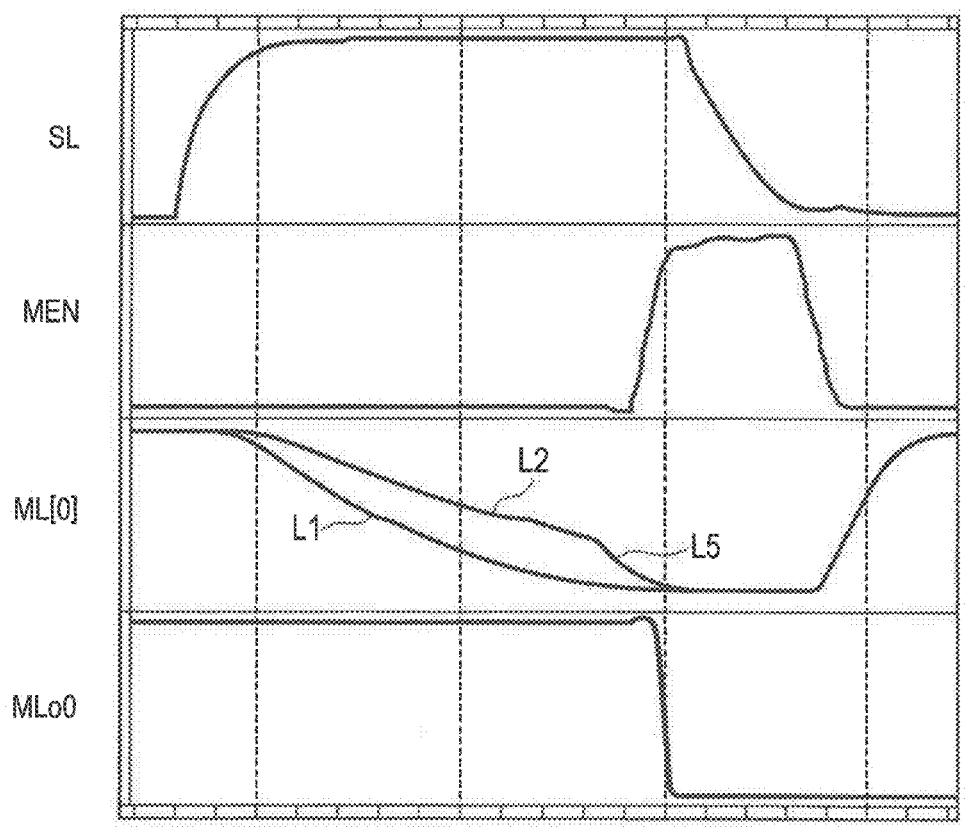
FIG. 4 is a diagram for explaining potential changes in the match line ML [0] according to a mode of carrying out the disclosure.

FIG. 4 is a diagram for explaining potential changes in the match line ML [0] according to the embodiment. Like FIG. 2, FIG. 4 illustrates simulation waveforms indicating potential changes of the match line ML [0] in the case of a mismatch. The vertical axis indicates voltage, and the horizontal axis indicates time. SL indicates the waveform of the search line pairs ST [0], SB [0] to ST [n], SB [n], and MEN indicates the waveform of the first match output enable signal MEN. ML [0] indicates the waveform of the match line ML [0], and MLo0 indicates the waveform of the match signal output line MLo0.

In FIG. 4, when the waveform of SL changes from the low level to the high level, the search access starts. Consequently, as illustrated by the waveform of ML [0], the level of the match line ML [0] gradually changes towards the low level. When the waveform of MEN changes from the low level to the high level, the level of the match line ML [0] at that time point is taken in the latch circuit LT0, and the match signal output line MLo0 changes from the high level to the low level as illustrated by the waveform of MLo0.

In the waveform of ML [0], waveforms L1 and L2 indicate changes in the potential of the low level of the match line ML [0] by the influence of the above-described manufacture variations. The waveform L2 indicates the case of a manufacture variation more than the case of the waveform L1. The waveform L2 changes to a waveform 5 at a some midpoint. The waveform 5 corresponds to the waveform of acceleration of the change to the low level of the match line ML[0] by the potential changing circuit DC0 in the match line potential changing circuit unit MLDC, and the potential of the match line ML[0] is discharged or drawn. Consequently, even in the case where the manufacture variations in the transistors including the data comparing unit of the memory cells MC00 to MC0n exist, the level difference of the low level of the match line ML[0] can be made almost equal to that of the waveform 1. Therefore, the speed of the search access of the content addressable memory can be increased.

Even in the case where a data word (entry) and a search word (search data) are different only by one bit, since the potential changing circuit DC0 in the match line potential changing circuit unit MLDC is provided, the speed of the change to the low level of the match line ML[0] is increased, and the speed of a search access of the content addressable memory can be increased.

Also in the case where only the memory cell MC00 arranged furthest from the match line output circuit MO0 does not match, the speed of the change to the low level of the match line ML[0] by the potential changing circuit DC0 in the match line potential changing circuit unit MLDC is increased, and the speed of a search access of the content addressable memory can be increased.

According to the embodiment, by providing the potential changing circuit DC0 in the match line potential changing circuit unit MLDC, the speed of the change to the low level of the match line ML[0] is increased, and the speed of the search access of the content addressable memory can be increased.

Example

Configuration of TCAM Cell

Figures 5, 6:
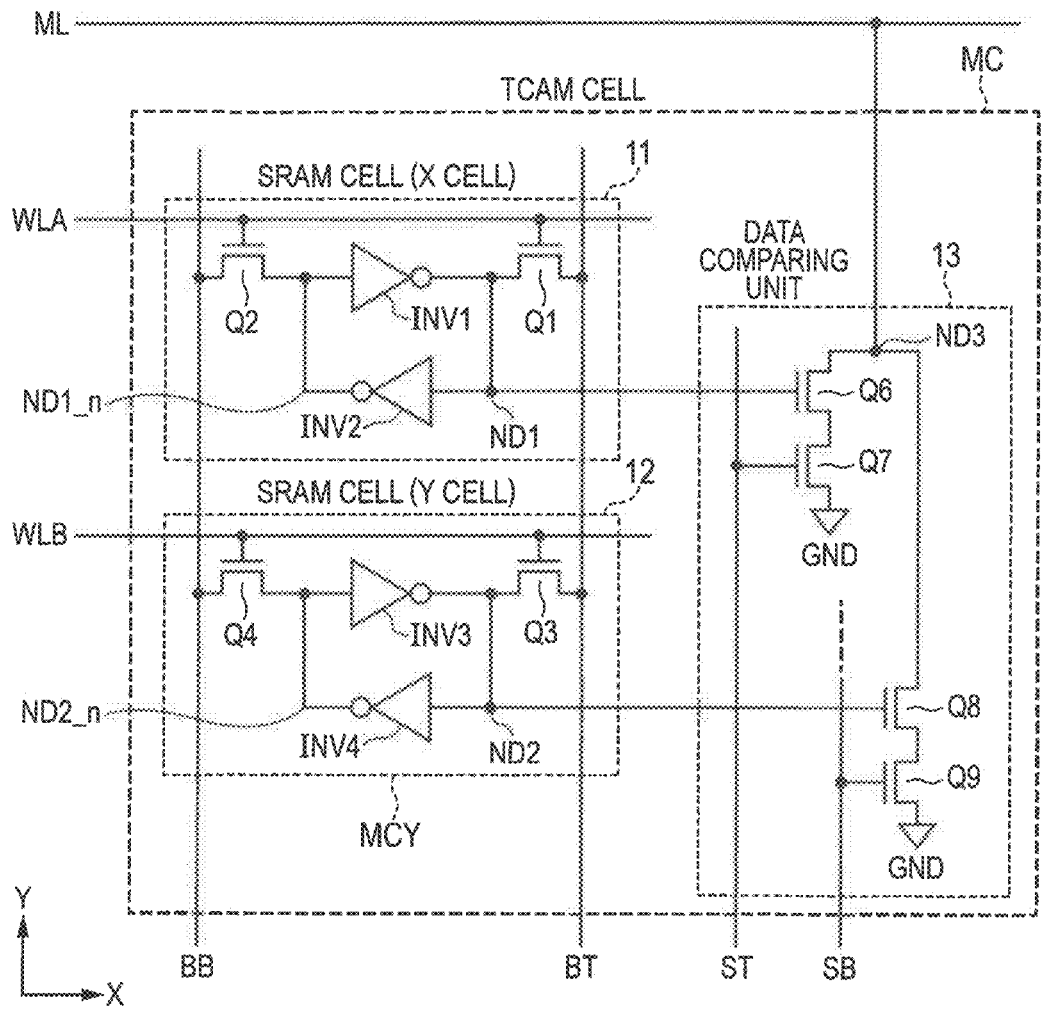
FIG. 5 is a circuit diagram illustrating an example of the configuration of a TCAM cell according to an example.
FIG. 6 is a diagram illustrating a corresponding relation between content stored in an X cell and a Y cell in FIG. 5 and data in the TCAM cell in a table format.

FIG. 5 is a circuit diagram illustrating an example of the configuration of a TCAM cell according to an example. In FIG. 5, a TCAM cell (also called a memory cell MC or a bit cell) includes two SRAM cells (Static Random Access Memory cells) 11 and 12 and a data comparing unit 13. The SRAM cell 11 is also called an X cell, and the SRAM cell 12 is also called a Y cell. The X cell 11 stores data of one bit in a pair of internal storage nodes ND1 and ND1_1 which become complementary to each other (when one of them is "1", the other becomes "0"). The Y cell 12 stores data of one bit in a pair of internal storage nodes ND2 and ND2_n which become complementary to each other.

The TCAM cell is coupled to a pair of bit lines BT and BB, a pair of search lines ST and SB, a match line ML, and word lines WLA and WLB. The pair of bit lines BT and BB extends in the column direction (Y direction) of a TCAM cell array 20 in FIG. 7 and is shared by a plurality of TCAM cells arranged in the column direction. The pair of search lines ST and SB extends in the column direction (Y direction) of the TCAM cell array 20 and is shared by a plurality of TCAM cells arranged in the column direction.

The match line ML extends in the row direction (X direction) of the TCAM cell array 20 and is shared by a plurality of TCAM cells arranged in the row direction. The word lines WLA and WLB extend in the row direction (X direction) of the TCAM cell array 20 and is shared by a plurality of TCAM cells arranged in the row direction. The word lines WLA and WLB can be also called first and second word lines, respectively.

The X cell 11 includes inverters INV1 and INV2 and N-channel MOS (Metal Oxide Semiconductor) transistors Q1 and Q2. The inverter INV1 is coupled between the storage nodes ND1 and ND1_n so that the direction from the storage node ND1_n to the storage node ND1 becomes the forward direction. The inverter INV2 is coupled in parallel to INV1 and in the opposite direction. The MOS transistor Q1 is coupled between the storage node ND1 and the bit line BT. The MOS transistor Q2 is coupled between the storage node ND1_n and the bit line BB. The gates of the MOS transistors Q1 and Q2 are coupled to the word line WLA.

The Y cell 12 includes inverters INV3 and INV4 and MOS (Metal Oxide Semiconductor) transistors Q3 and Q4. The inverter INV3 is coupled between the storage nodes ND2 and ND2_n so that the direction from the storage node ND2_n to the storage node ND2 becomes the forward direction. The inverter INV4 is coupled in parallel to INV3 and in the opposite direction. The MOS transistor Q3 is coupled between the storage node ND2 and the bit line BT. The MOS transistor Q4 is coupled between the storage node ND2_n and the bit line BB. The gates of the MOS transistors Q3 and Q4 are coupled to the word line WLB.

The data comparing unit 13 includes N-channel MOS transistors Q6 to Q9. The MOS transistors Q6 and Q7 are coupled in series between a node ND3 as the coupling point to the match line ML and a ground node GND. The MOS transistors Q8 and Q9 are coupled in series between the node ND3 and the ground node GND and in parallel to the whole of the MOS transistors Q6 and Q7 coupled in series. The gates of the MOS transistors Q6 and Q8 are coupled to the storage nodes ND1 and ND2, respectively. The gates of the MOS transistors Q7 and Q9 are coupled to the search lines ST and SB, respectively.

Memory cells of a BCAM can be configured by, for example, in FIG. 5, eliminating the word line WLB and the Y cell and coupling the gate electrode of the MOS transistor Q8 to the storage node ND1_$n$ in the X cell.

FIG. 6 is a diagram illustrating a corresponding relation between content stored in the X cell and the Y cell in FIG. 5 and data in the TCAM cell in a table format.

With reference to FIGS. 5 and 6, the TCAM cell can store three values of "0", "1", and "x" (don't care) by using an SRAM cell of two bits. Concretely, it is assumed that when "1" is stored in the storage node ND1 in the X cell 11 and "0" is stored in the storage node ND2 in the Y cell 12, "0" is stored in the TCAM cell. It is assumed that when "0" is stored in the storage node ND1 in the X cell 11 and "1" is stored in the storage node ND2 in the Y cell 12, "1" is stored in the TCAM cell. It is assumed that when "0" is stored in the storage node ND1 in the X cell 11 and "0" is stored in the storage node ND2 in the Y cell 12, "x" (don't care) is stored in the TCAM cell. "1" is not stored in both the storage node ND1 in the X cell 11 and the storage node ND2 in the Y cell 12.

In the configuration of the TCAM Cell, when the search data is "1" (that is, the search line ST is "1" and the search line SB is "0") and the TCAM data is "0" (the storage node ND1 is "1" and the storage node ND2 is "0"), the MOS transistors Q6 and Q7 become the on state, so that the potential of the match line ML pre-charged is drawn to the ground potential. When the search data is "0" (that is, the search line ST is "0" and the search line SB is "1") and the TCAM data is "1" (the storage node ND1 is "0" and the storage node ND2 is "1"), the MOS transistors Q8 and Q9 become the on state, so that the potential of the match line ML pre-charged is drawn to the ground potential. That is, when the search data and the TCAM data do not match, the potential of the match line ML is drawn to the ground potential.

On the contrary, when the input search data is "1" and the TCAM data is "1" or "x", or when the search data is "0" and the TCAM data is "0" or "X" (that is, when both of them match), the potential of the pre-charged match line ML (power supply potential VDD level) is maintained.

As described above, in the TCAM, as long as the data of all of TCAM cells coupled to the match line ML corresponding to one entry (row) do not match the input search data, the charges accumulated in the match line ML are drawn.

Configuration of Array

Figure 7:
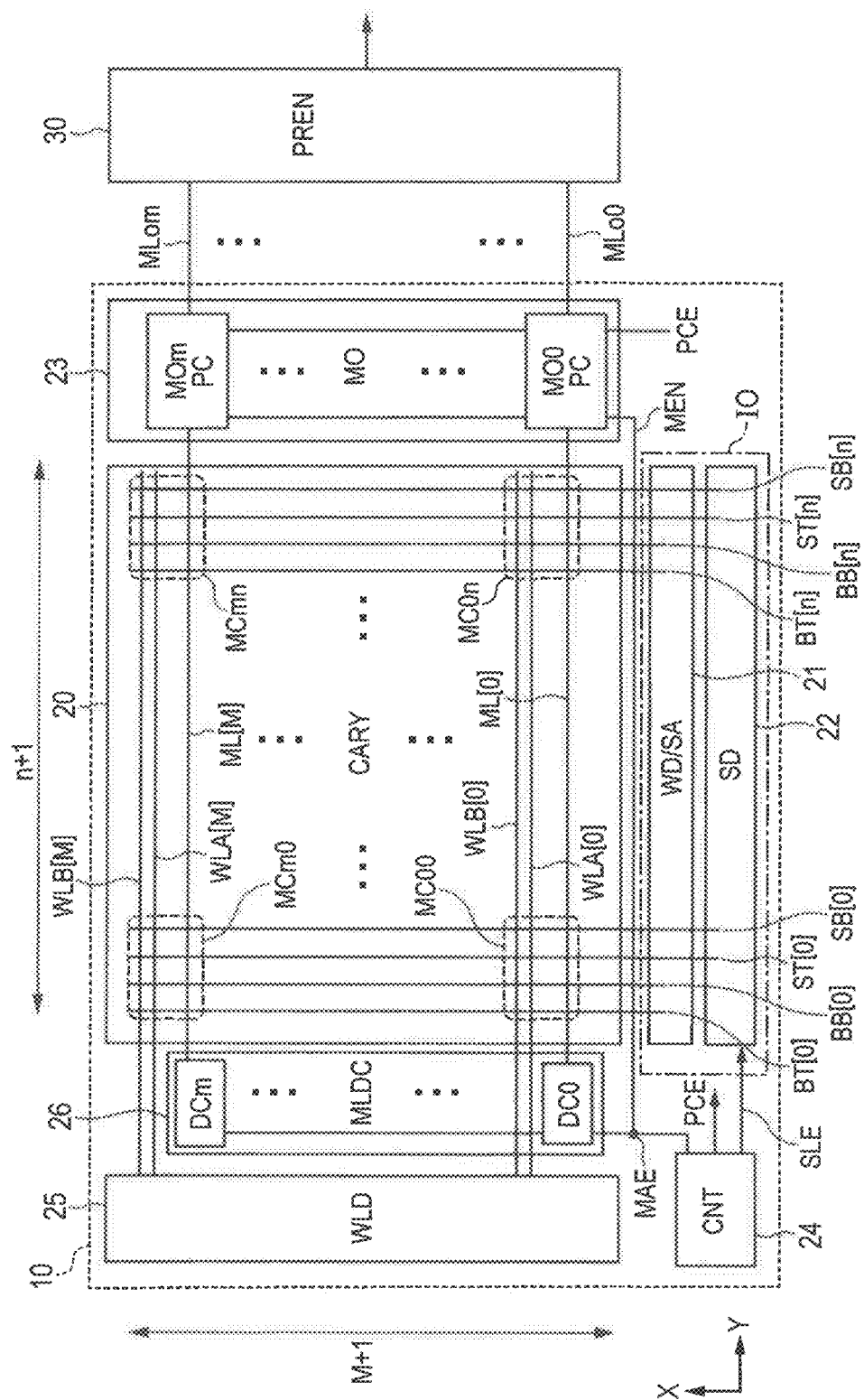
FIG. 7 is a block diagram illustrating the configuration of a TCAM device according to an example.

FIG. 7 is a block diagram illustrating the configuration of a TCAM device according to an example. A TCAM device 1 is provided, for example, in a semiconductor device. In FIG. 7, the TCAM device 1 includes the TCAM macro cell 10 and a priority encoder (PREN) 30. The TCAM macro cell 10 includes a TCAM cell array (CARY) 20 (also simply called a cell array), an input/output circuit unit IO including a writing-driver and reading sense amplifier (WD/SA) 21 and a search line driver (SD) 22, a match line output circuit unit (MO) 23, a control logic circuit (CNT) 24, and a word line driver (WLD) 25 for driving the word lines WLA and WLB in FIG. 5. The TCAM macro cell 10 further includes a match line potential changing circuit unit (MLDC) 26.

The cell array 20 includes TCAM cells (MC00 to MC0$n$, MCm0 to MCmn) arranged in an array shape (M+1 rows and n+1 columns). The cell array 20 in the case where the number of rows (the number of entries) is M+1 (M is a positive integer) and the number of columns (the number of bits of an entry) is n+1 (n is a positive integer) is illustrated.

In correspondence with each of the columns of the cell array 20, n+1 bit line pairs (BT [0],BB[0] to BT [n],BB [n]) and n+1 search line pairs (ST [0], SB [0] to ST [n], SB [n]) are provided. In correspondence with each of the rows of the cell array 20, M+1 match lines (ML [0] to ML [M]), M+1 word lines for X cells (WLA [0] to WLA[M]), and M+1 word lines (WLB [0] to WLB [M]) for Y cells are provided. The word lines (WLA [0] to WLA[M]) are first word lines, and the word lines (WLB[0] to WLB[M]) are second word lines.

The write-driver and reading sense amplifier 21 includes a write driver WD and a sense amplifier SA for reading. At the time of writing, the write driver WD supplies write data to each of the TCAM cells via the pair of bit lines BT and BB. At the time of reading, the sense amplifier SA for reading amplifies data read from each of the TCAM cells via the pair of bit lines BT and BB and outputs the amplified data.

At the time of a search, the search line driver 22 supplies search data to each of the TCAM cells via the search line pairs (ST [0], SB [0] to ST [n], SB [n]).

The control logic circuit (CNT) 24 controls the entire TCAM macro cell 10. For example, at the time of a search, the control logic circuit 24 receives a search command and, by outputting a control signal to the search line driver (SD) 22 and the match line output circuit unit (MO) 23, controls the operation of the search line driver (SD) 22, the match line output circuit unit (MO) 23, and a pre-charge circuit (first pre-charge circuit) PC. At the time of writing, the control logic circuit 24 controls the operation of the write driver WD and the word line driver (WLD) 25 by outputting the control signal to the write driver WD and the word line driver (WLD) 25. At the time of reading, the control logic circuit 24 controls the operation of the word line driver (WLD) 25 and the sense amplifier SA for reading by outputting the control signal to the word line driver (WLD) 25 and the sense amplifier SA for reading.

The control logic circuit 24 outputs the first match output enable signal MAE to the match line potential changing circuit unit (MLDC) 26, and outputs the second match output enable signal MEN to the match line output circuit unit (MO) 23. A line to which the first match output enable signal MAE and the second match output enable circuit MEN are supplied is provided among the control logic circuit 24, the match line potential changing circuit unit (MLDC) 26, and the match line output circuit unit (MO) 23.

The control logic circuit 24 outputs a pre-charge enable signal PCE instructing pre-charging to the pre-charge circuit PC and outputs a search line enable signal SLE instructing a searching operation or a search accessing operation to the search line driver 22.

The match line output circuit unit (MO) 23 has a plurality of match line output circuits MO0 to MOm corresponding to the rows of the cell array. The inputs of the match line output circuits MO0 to MOm are coupled to the corresponding match lines ML (ML[0] to ML[M]), and the outputs of the match line output circuits MO0 to MOm are coupled to the corresponding match signal output lines MLo (MLo0 to MLom). The match line output circuits MO0 to MOm further receive the second match output enable signal MEN. At the time of a search, the match line output circuits MO0 to MOm generate a detection signal of whether corresponding TCAM cell data and a corresponding part of input search data match or not on the basis of the potential of the corresponding match line ML (ML [0] to ML [M]) and output the detection signal to the corresponding match signal output lines MLo (MLo0 to MLom). In this example, each of the match line output circuits MO0 to MOm includes the pre-charge circuit PC for setting the corresponding match lines ML [0] to ML[M] to the pre-charge potential at the time of a search.

The match line potential changing circuit unit (MLDC) 26 has a plurality of potential changing circuits (match line drawing amplification circuits) DC0 to DCm corresponding to the rows of the cell array. The potential changing circuits DC0 to DCm are coupled to the corresponding match lines ML (ML [0] to ML [M]), respectively, and receive the first match output enable signal MAE. The potential changing circuits DC0 to DCm are provided to discharge or draw the potential of the match lines ML (ML [0] to ML [M]) in accordance with the selection level such as the high level of the first match output enable signal MAE. The potential changing circuits DC0 to DCm can be also mentioned as match line potential drawing circuits or match line potential discharging circuits. The match line potential changing circuit (MLDC) 26 is arranged between the TCAM cell array (CARY) 20 and the word line driver (WLD) 25. The TCAM cell array (CARY) 20 is arranged between the match line potential changing circuit unit (MLDC) 26 and the match line output circuit unit (MO) 23.

In the case where some of a plurality of match signal output lines MLo0 to MLom are set to a signal level indicating a match at the time of a search in normal operation, the priority encoder (PREN) 30 is provided to select one match signal output line in accordance with predetermined priority.

Figure 8:
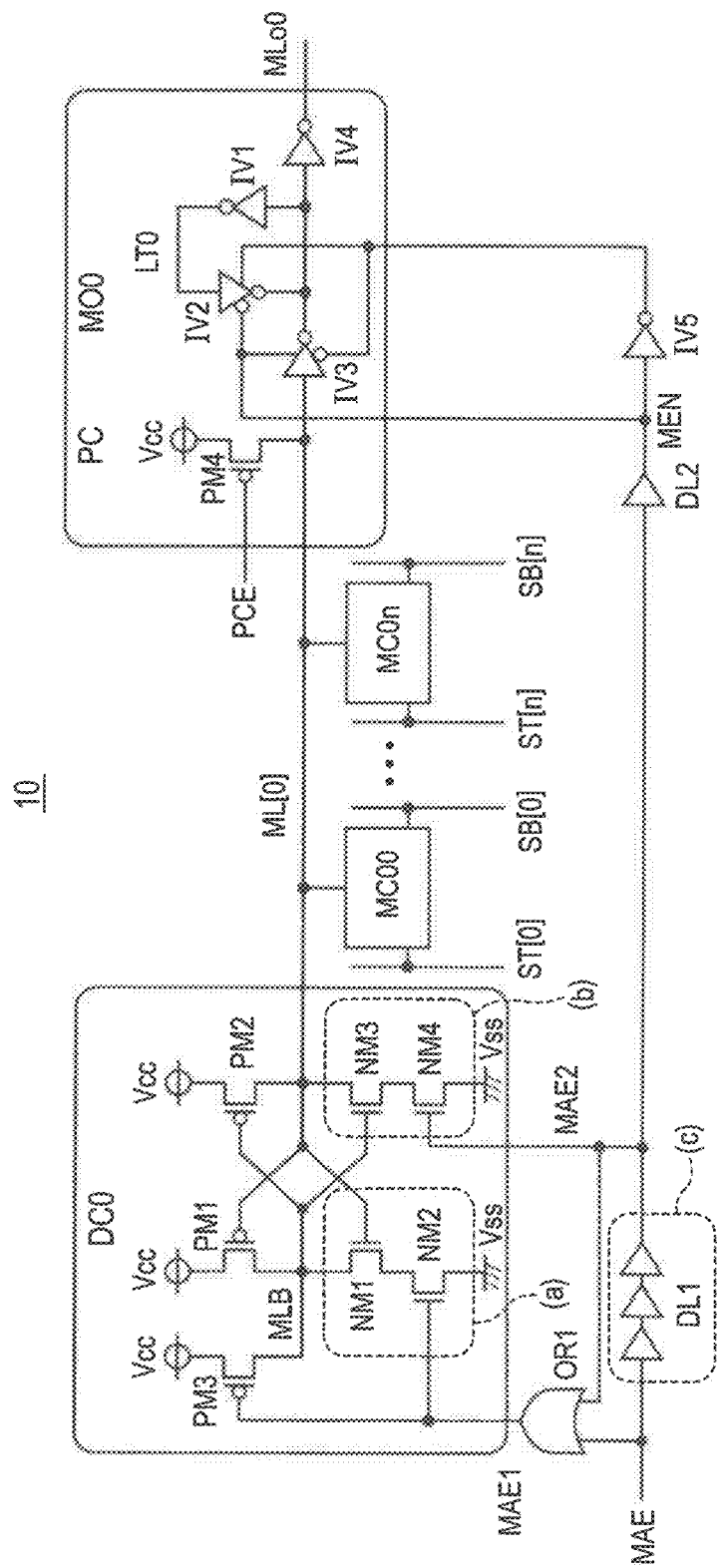
FIG. 8 is a diagram illustrating a circuit example corresponding to one entry of a TCAM macro cell according to the example.

FIG. 8 is a diagram illustrating a circuit example corresponding to one entry of a TCAM macro cell according to the example. FIG. 8 illustrates the match line ML [0], the potential changing circuit (match line drawing amplification circuit) DC0 in the match line potential changing circuit (MLDC) 26 coupled to one end of the match line ML [0], and the match line output circuit MO0 and the pre-charge circuit PC of the match line output circuit unit (MO) 23 coupled to the other end of the match line ML(0). The plurality of TCAM cells (MC00 to MC0n) are coupled to the match line ML[0], and the search line pairs (ST[0],SB[0] to ST[n],SB[n]) are coupled to the plurality of TCAM cells (MC00 to MC0n). In FIG. 8, to simplify the drawing, the bit line pairs (BT[0],BB[0] to BT[n],BB[n]), the word line WLA[0], and the word line WLB[0] are not illustrated. Other entries are also included in a manner similar to the circuit example illustrated in FIG. 8.

The match line output circuit MO0 includes the inverter circuits IN1 to IN4, and the latch circuit LT0 is included by the inverter circuits IV1 and IV2. The input of the latch circuit LT0 is coupled to the match line ML[0] via the inverter circuit IV3. The output of the latch circuit LT0 is coupled to the match signal output line MLo0 via the inverter circuit IV4. The operation of the inverter circuits IV2 and IV3 is controlled by the second match output enable signal MEN and an inversion signal of the second match output enable signal MEN generated by an inverter circuit IV5. The second match output enable signal MEN is generated by delaying the first match output enable signal MAE by delay elements DL1 and DL2. When the second match output enable signal MEN is set to a selection level such as the high level, the inverter circuit IV3 is set to the on state, the inverter circuit IV2 is set to the off state, and the level of the match line ML[0] is taken into the latch circuit LT0. When the second match output enable signal MEN is set to a non-selection level such as the low level, the inverter circuit IV3 is set to the off state, the inverter circuit IV2 is set to the on state, and the level of the match line ML[0] is held in the latch circuit LT0.

The pre-charge circuit PC is included by a P-channel MOS transistor PM4. The P-channel MOS transistor PM4 is provided to charge the match line ML[0] to a pre-charge potential such as the high level. The gate of the P-channel MOS transistor PM4 receives, for example, a pre-charge enable signal PCE. The pre-charge enable signal PCE is set to a signal such as the inversion signal of the search line enable signal SLE instructing search operation or search access operation. That is, when the search operation or search access operation is not performed, the pre-charge enable signal PCE is set to a selection level such as the low level, and the pre-charge circuit PC pre-charges the match line ML [0]. On the other hand, in the case of the search operation or the search access operation, the pre-charge enable signal PCE is set to a non-selection level such as the high level, and the pre-charge circuit PC stops pre-charging of the match line ML [0].

The potential changing circuit (match line drawing amplification circuit) DC0 includes a P-channel MOS transistor PM1 and an N-channel MOS transistor NM1 whose gates are coupled to the match line ML [0] and an N-channel MOS transistor NM2. The source-drain path of the P-channel MOS transistor PM1 and the N-channel MOS transistors NM1 and NM2 is coupled in series between a first reference potential Vcc such as the power supply potential and a second reference potential Vss such as the ground potential. The gate of the N-channel MOS transistor NM2 is coupled to the output of an OR circuit OR1 and receives a first delay match output enable signal MAE1. The OR circuit OR1 receives the first match output enable signal MAE and a second delay match output enable signal MAE2 delayed by the delay element DL1.

The potential changing circuit DC0 also includes, between the first reference potential Vcc and the second reference potential Vss, a P-channel MOS transistor PM2, an N-channel MOS transistor NM3, and an N-channel MOS transistor NM4 whose source-drain path is coupled in series. A common coupling node between the P-channel MOS transistor PM2 and the N-channel MOS transistor NM3 is coupled to the match line ML [0]. The gates of the P-channel MOS transistor PM2 and the N-channel MOS transistor NM3 are coupled to a common coupling node MLB of the P-channel MOS transistor PM1 and the N-channel MOS transistor NM1 (the drains of the P-channel MOS transistor PM1 and the N-channel MOS transistor NM1). The gate of the N-channel MOS transistor NM4 receives the second delay match output enable signal MAE2 generated by delaying the first match output enable signal MAE by the delay element DL1.

The potential changing circuit DC0 also includes a P-channel MOS transistor PM3. The source-drain path of the P-channel MOS transistor PM3 is coupled between the first reference potential Vcc and the common coupling node MLB, and the gate of the P-channel MOS transistor PM3 receives the first delay match output enable signal MAE1.

Next, with reference to FIGS. 9 and 10, the operation of the potential changing circuit DC0 will be described.

Figure 9:
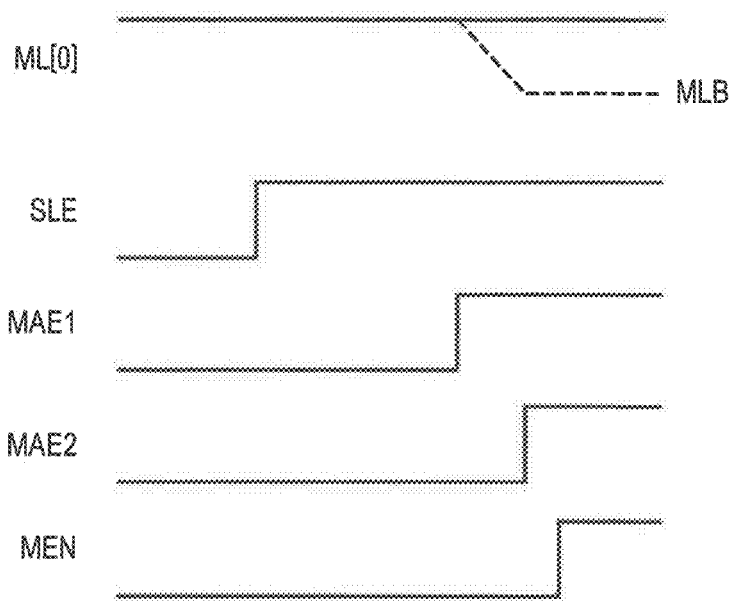
FIG. 9 is a diagram illustrating the case where a match line ML maintains the high level.
Figure 10:
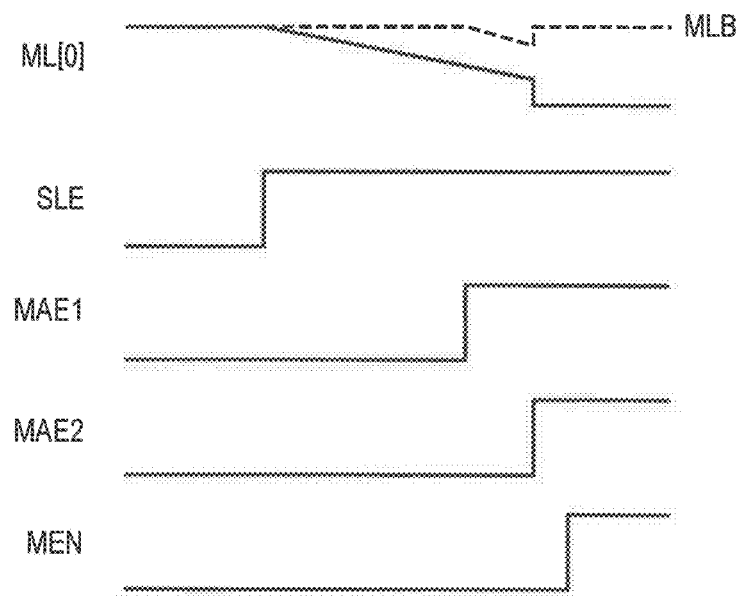
FIG. 10 is a diagram illustrating the case where the match line ML shifts to the low level.

FIG. 9 is a diagram illustrating the case where the match line ML[0] maintains the high level, and FIG. 10 is a diagram illustrating the case where the match line ML[0] shifts to the low level.

In FIG. 9, by the change of the search line enable signal SLE from the low level to the high level, a search access starts. When a data word (entry) stored in the plurality of memory cells MC00 to MC0$n$ matches a search word (search data) which is input from the search line pairs ST [0], SB [0] to ST [n], SB [n], the match line ML [0] maintains the pre-charge potential such as the high level.

After that, the first delay match output enable signal MAE1 shifts from the low level to the high level and, subsequently, the second delay match output enable signal MAE2 shifts from the low level to the high level.

By the high level of the first delay match output enable signal MAE1, the P-channel MOS transistor PM3 shifts from the on state to the off state. The N-channel MOS transistor NM2 shifts from the off state to the on state. By the operation, the P-channel MOS transistor PM1 and the N-channel MOS transistor NM1 are set to the off state and the on state in accordance with the high level of the match line ML [0], so that the common coupling node MLB gradually shifts to the low level as indicated by the broken line. At this time, by the high level of the second delay match output enable signal MAE2, the N-channel MOS transistor NM4 shifts from the off state to the on state. As a result, the P-channel MOS transistor PM2 and the N-channel MOS transistor NM3 are set to the on state and the off state by the low level of the common coupling node MLB, and the match line ML [0] maintains the pre-charge potential such as the high level. After that, according to the shift from the low level to the high level of the second match output enable signal MEN, the latch circuit LT0 takes in the high level of the match line ML [0] and holds it, and the high level held in the latch circuit LT0 is output to the match signal output line MLo0.

In FIG. 10, by the change of the search line enable signal SLE from the low level to the high level, a search access starts. When a data word (entry) stored in the plurality of memory cells MC00 to MC0$n$ does not match a search word (search data) which is input from the search line pairs ST [0],SB [0] to ST [n],SB[n], the match line ML [0] gradually shifts from the pre-charge potential such as the high level to the low level.

After that, the first delay match output enable signal MAE1 shifts from the low level to the high level and, subsequently, the second delay match output enable signal MAE2 shifts from the low level to the high level.

By the high level of the first delay match output enable signal MAE1, the P-channel MOS transistor PM3 shifts from the on state to the off state. The N-channel MOS transistor NM2 shifts from the off state to the on state. By the operation, the P-channel MOS transistor PM1 and the N-channel MOS transistor NM1 are set to a weak on state and a weak off state in accordance with the level shift of the match line ML [0], so that the level of the common coupling node MLB shifts to the level slightly lower than the high level as indicated by the broken line. At this time, by the high level of the second delay match output enable signal MAE2, the N-channel MOS transistor NM4 shifts from the off state to the on state. As a result, the P-channel MOS transistor PM2 and the N-channel MOS transistor NM3 are set to the off state and the on state by the weak high level of the common coupling node MLB, and the level of the match line ML [0] shifts to the low level by high-speed discharging or drawing. That is, by the second delay match output enable signal MAE2, the match line ML[0] is additionally driven. After that, according to the shift from the low level to the high level of the second match output enable signal MEN, the latch circuit LT0 takes in the low level of the match line ML[0] and holds it, and the low level held in the latch circuit LT0 is output to the match signal output line MLo0.

As illustrated in FIG. 10, the potential changing circuit DC0 shifts the level of the match line ML[0] to the low level by high-speed discharging or drawing. Consequently, the speed of the search access is not influenced by the number or position of memory cells discharging the load capacity of the match line ML[0]. The speed of the search access is not also influenced by manufacture variations in the transistors in the plurality of memory cells MC00 to MC0$n$ or manufacture variations in the transistors including the data comparing unit of the plurality of memory cells MC00 to MC0$n$.

Figure 11:
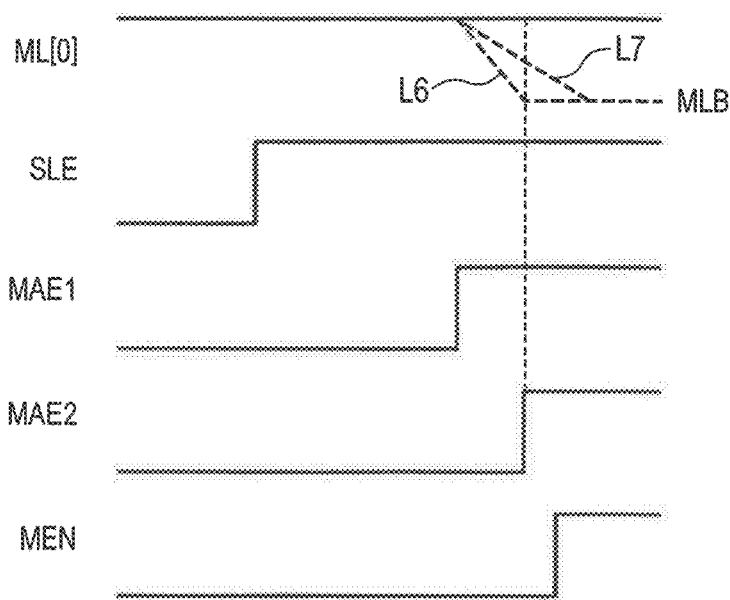
FIG. 11 is a diagram illustrating the influence of manufacture variations in N-channel MOS transistors NM1 and NM2 in FIG. 8.
Figure 12:
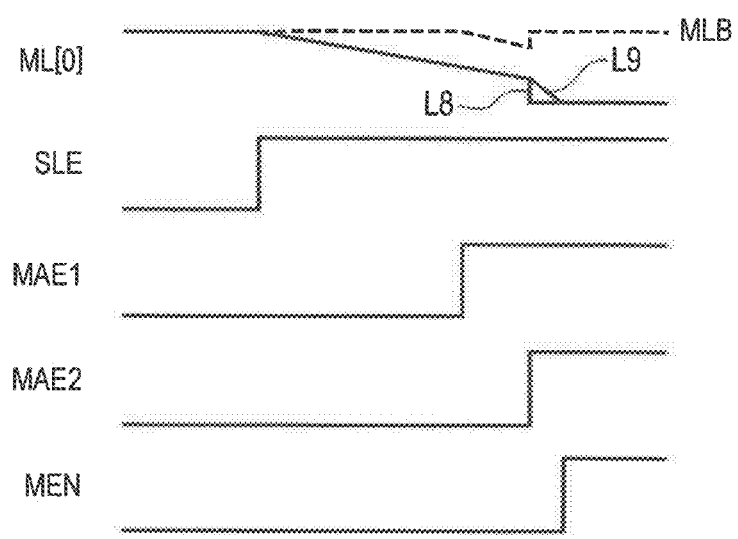
FIG. 12 is a diagram illustrating the influence of manufacture variations in N-channel MOS transistors NM3 and NM4 in FIG. 8.

FIG. 11 is a diagram illustrating the influence of manufacture variations in the N-channel MOS transistors NM1 and NM2 in FIG. 8, and FIG. 12 is a diagram illustrating the influence of manufacture variations in the N-channel MOS transistors NM3 and NM4 in FIG. 8.

In FIG. 8, the N-channel MOS transistors NM1 and NM2 surrounded by the rectangular shape (a) of a broken-line are transistors for discharging the potential of the common coupling node MLB when the search result indicates a match. When manufacture variations occur in the N-channel MOS transistors NM1 and NM2, the speed of the shift from the high level to the low level of the common coupling node MLB changes from the waveform L6 to the waveform L7 as illustrated in FIG. 11. That is, the shift speed of the common coupling node MLB becomes slower. Consequently, when the common coupling node MLB shifts as illustrated by line L7, in some cases, erroneous operation occurs at the time of the shift from the low level to the high level of the second delay match output enable signal MAE2.

On the other hand, in FIG. 8, the N-channel MOS transistors NM3 and NM4 surrounded by the rectangular shape (b) of a broken-line are transistors for discharging the potential of the match line ML [0] at high speed when the search result indicates a mismatch. When manufacture variations occur in the N-channel MOS transistors NM3 and NM4, the speed of the shift from the high level to the low level of the match line ML [0] changes from the waveform L8 to the waveform L9 as illustrated in FIG. 12. That is, the shift speed of the match line ML [0] becomes slower, and discharging or drawing of the potential of the match line ML [0] becomes slower, so there is the possibility that increase in the speed of the search access is limited.

As a measure against the problem described with reference to FIGS. 11 and 12, the gate length (Lg1) of each of the N-channel MOS transistors NM1 and NM2 is set to be longer than the gate length (Lg2) of each of the N-channel MOS transistors NM3 and NM4 (Lg1>Lg2). The gate width (Wg2) of each of the N-channel MOS transistors NM3 and NM4 is set to be wider than the gate width (Wg1) of each of the N-channel MOS transistors NM1 and NM2 (Wg2>Wg1).

Since the operation margin of the transistors NM1 and NM2 in (a) which directly receive the potential of the match line ML [0] which slowly operates changes due to the threshold fluctuations caused by the variations, by increasing the gate length of the transistors NM1 and NM2, the variations are reduced. On the other hand, to operate a large load capacity of the match line ML [0] at high speed, the gate width of the transistors NM3 and NM4 in (b) driving the match line ML [0] is increased.

As described above, by increasing the gate length of each of the N-channel MOS transistors NM1 and NM2, the influence by the local manufacture variations in the N-channel MOS transistors NM1 and NM2 can be reduced. By widening the gate width of each of the N-channel MOS transistors NM3 and NM4, the shift speed of the match line ML [0] can be increased.

Figure 13:
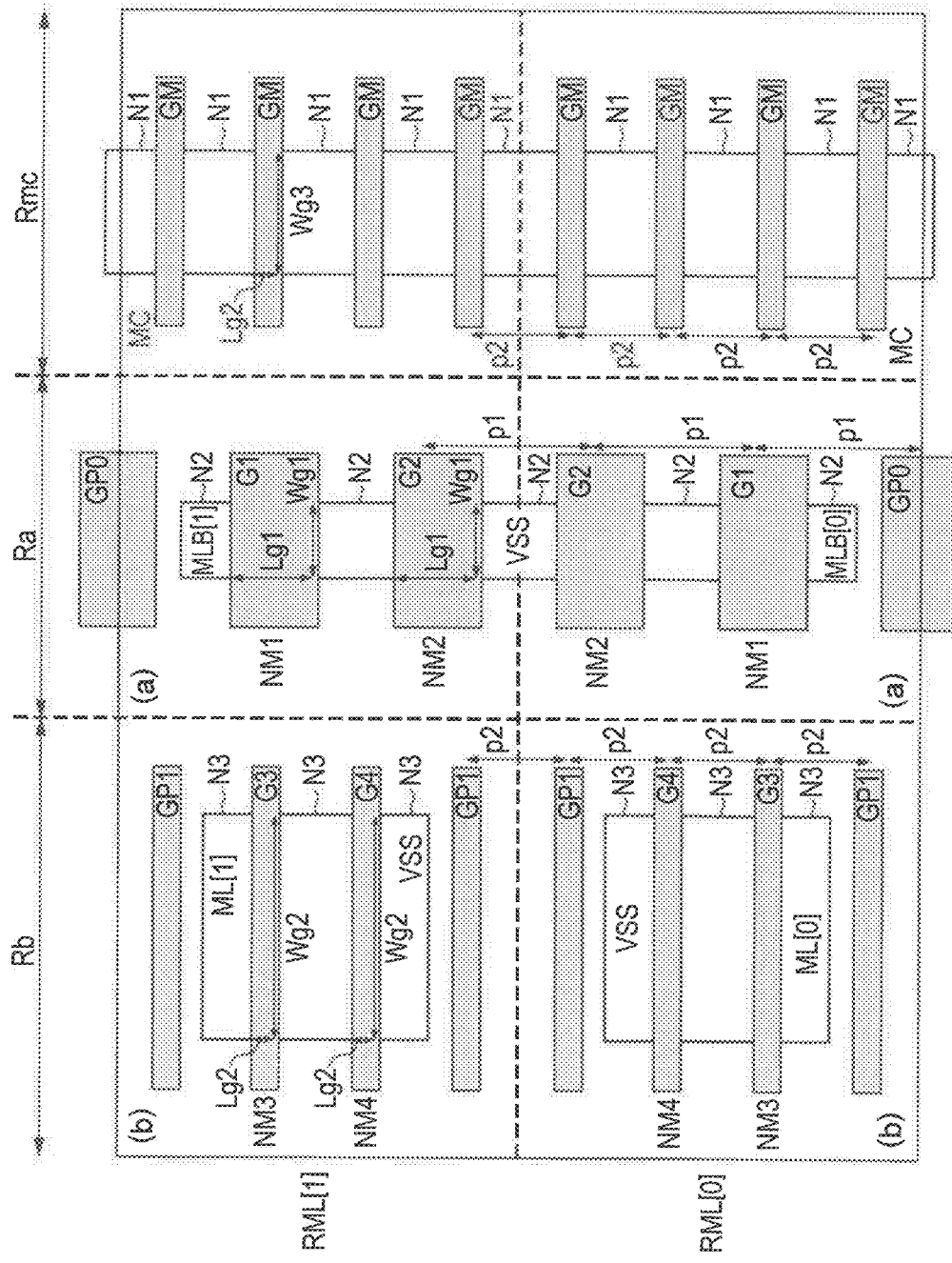
FIG. 13 is a diagram illustrating the relation between gate length and gate width.

FIG. 13 is a diagram illustrating the relation between gate length and gate width.

In FIG. 13, a memory cell region Rmc, a formation region Ra of the N-channel MOS transistors NM1 and NM2 in FIG. 8, and a formation region Rb of the N-channel MOS transistors NM3 and NM4 in FIG. 8 are drawn. In each of the regions Rmc, Ra, and Rb, gate patterns (GM, G1, G2, GP0, G3, G4, and GP1) and N-type impurity layer patterns (N1, N2, and N3) are drawn with respect to a region RML [0] on the match line ML [0] side and a region RML [1] on the match line ML [1] side. The N-channel MOS transistors NM1, NM2, NM3, and NM4 are planar-type MOS transistors, and N-type impurity layer patterns (N1, N2, and N3) are regions which become sources or drains of the N-channel MOS transistors.

To avoid complexity, exemplarily, on the region RML [0] side, mainly, symbols (p1, p2, and p3) of intervals (pitches) of the gates will be described. On the region RML [1] side, mainly, symbols of the gate widths and gate lengths will be described. The interval (pitch) of the gates denotes the interval between the center of one of a pair of gate patterns and the center of the other gate pattern.

FIG. 13 illustrates the layout of the N-channel MOS transistors formed in a semiconductor substrate made of single-crystal silicon, and an insulating film made of silicon oxide or the like is formed on the outside of the N-type impurity layer patterns (N1, N2, and N3). The gates (GM, G1, G2, GP0, G3, G4, and GP1) are formed by, for example, a polycrystalline silicon film. In the N-type impurity layer patterns (N2 and N3), symbols (Vss, MLB [0], MLB [1], ML [0], and ML [1]) written on the inside indicate signal lines or coupling nodes coupled to the N-type impurity layer patterns. In FIG. 13, MLB [0] denotes the common coupling node MLB in FIG. 8, and MBL [1] denotes the common coupling node MLB of the potential changing circuit DC1 coupled to the match line ML [1].

In the memory cell region Rmc, regions of two memory cells MC are illustrated. In each of the regions of the memory cells MC, four gates GM of four N-channel MOS transistors are exemplarily illustrated. In each gate GM, gate width is expressed as Wg3 and gate length is expressed as Lg2. N1 denotes an N-type impurity layer pattern. Each of the intervals (pitches) of the four gates GM is distance p2.

In the region Ra, the patterns of the N-channel MOS transistors NM1 and NM2 in the part (a) in FIG. 8 are illustrated. The gate G1 of the N-channel MOS transistor NM1, the gate G2 of the N-channel MOS transistor NM2, and the gate pattern GP0 are illustrated. Each of the gates G1 and G2 has gate width Wg1 and gate length Lg1. N2 denotes an N-type impurity layer pattern. The interval (pitch) of the gates G1, G2, and Gp0 is distance p1 which is wider than the distance p2 (p1>p2).

In the region Rb, the patterns of the N-channel MOS transistors NM3 and NM4 in the part (b) in FIG. 8 are illustrated. The gate G3 of the N-channel MOS transistor NM3, the gate G4 of the N-channel MOS transistor NM4, and the gate pattern GP1 are illustrated. Each of the gates G3 and G4 has gate width Wg2 and gate length Lg2. N3 denotes an impurity layer pattern. The interval (pitch) of the gates G3, G4, and Gp1 is distance p2 (p1>p2).

The interval (p2) of the gates G3, G4, and GP1 is the same as the interval (p2) of the gate GM. On the other hand, since the gate length Lg1 is longer than the gate length Lg2, the intervals (p1) of the gates G1, G2, and GP0 are not the same but the layout is made so that the height becomes the same as that of the memory cell MC. The gate widths have relations such as Wg1≤Wg3>Wg2.

Consequently, by increasing the gate length of each of the N-channel MOS transistors NM1 and NM2, the influence of the local manufacture variations in the N-channel MOS transistors NM1 and NM2 can be reduced. By increasing the gate width of each of the N-channel MOS transistors NM3 and NM4, the shift speed of the match line ML [0] can be increased.

Figure 14:
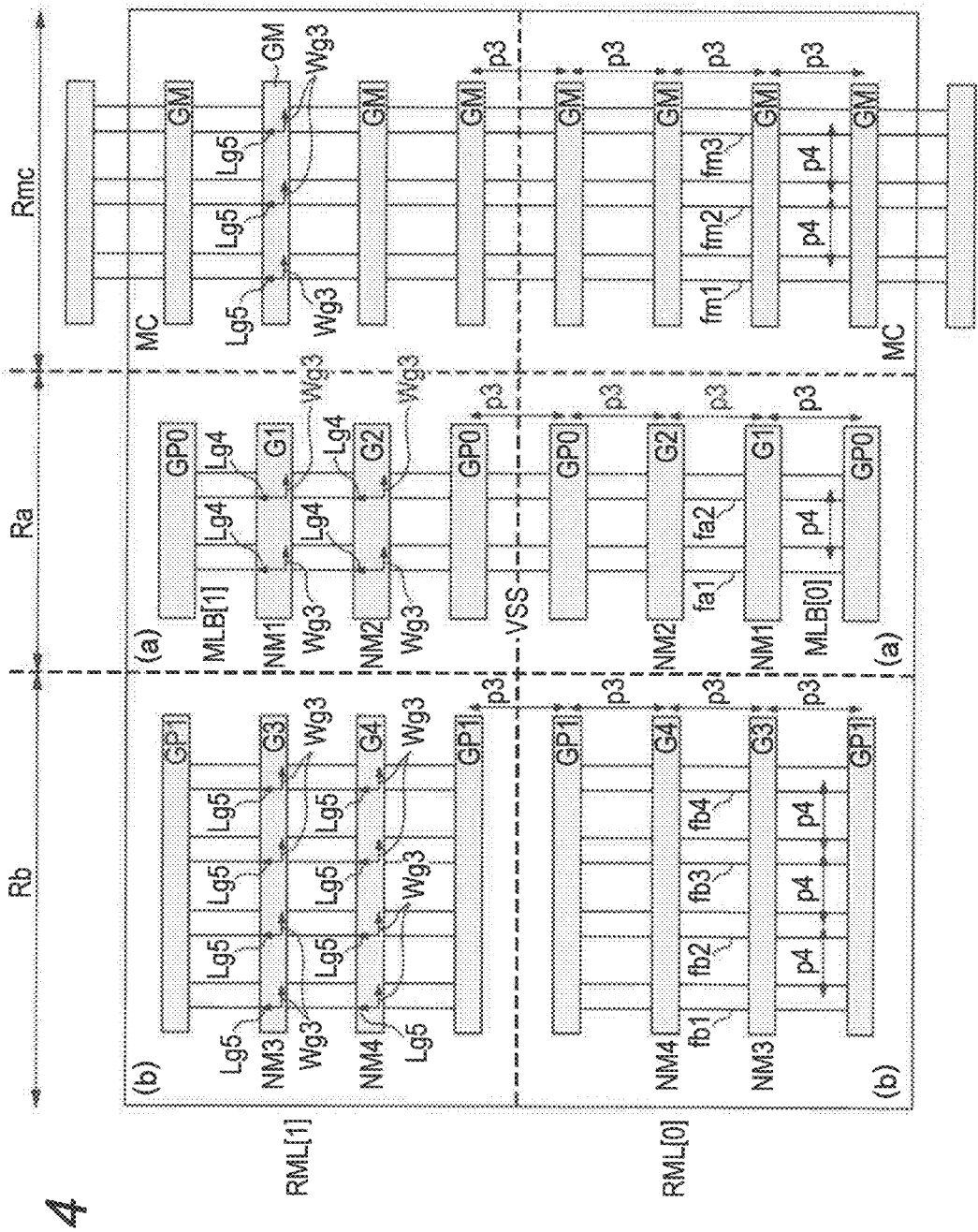
FIG. 14 is a diagram illustrating the case of applying the present disclosure to a Fin-type transistor (FinFET).

FIG. 14 is a diagram illustrating the case of applying the technological thought of FIG. 13 to a Fin-type transistor (FinFET).

In the memory cell region Rmc, regions of two memory cells MC are illustrated. In each of the regions of the memory cells MC, four gates GM of four N-channel MOS transistors are exemplarily illustrated. In each gate GM, gate width is expressed as Wg3 and gate length is expressed as Lg5. The interval (pitch) of the gates GM is distance p3. fm1, fm2, and fm3 denote fins. In this example, the three fins fm1, fm2, and fm3 are used for the memory cell MC. The interval (pitch) of the three fins fm1, fm2, and fm3 is distance p4.

In the region Ra, the patterns of the N-channel MOS transistors NM1 and NM2 in the part (a) in FIG. 8 are illustrated. The gate G1 of the N-channel MOS transistor NM1, the gate G2 of the N-channel MOS transistor NM2, and the gate pattern GP0 are illustrated. Each of the gates G1 and G2 has gate width Wg3 and gate length Lg4. The gate length Lg4 is longer than the gate length Lg5 (Lg4>Lg5). The interval (pitch) of the gates G1, G2, and Gp0 is distance p3. fa1 and fa2 are fins and, in this example, the two fins fa1 and fa2 are used for the N-channel MOS transistors NM1 and NM2. The interval (pitch) of the two fins fa1 and fa2 is the distance p4. The N-channel MOS transistors NM1 and NM2 have a configuration that two pairs of transistors are coupled in parallel by using the two fins fa1 and fa2. The gate width of each of the N-channel MOS transistors NM1 and NM2 is Wg3×2.

In the region Rb, the patterns of the N-channel MOS transistors NM3 and NM4 in the part (b) in FIG. 8 are illustrated. The gate G3 of the N-channel MOS transistor NM3, the gate G4 of the N-channel MOS transistor NM4, and the gate pattern GP1 are illustrated. Each of the gates G3 and G4 has gate width Wg3 and gate length Lg5. The interval (pitch) of the gates G3, G4, and GP1 is distance p3. fb1, fb2, fb3, and fb4 are fins. In this example, the four fins fb1, fb2, fb3, and fb4 are used for the N-channel MOS transistors NM3 and NM4. The interval (pitch) of the four fins fb1, fb2, fb3, and fb4 is the distance p4. The N-channel MOS transistors NM3 and NM4 have a configuration that four pairs of transistors are coupled in parallel by using the four fins fb1, fb2, fb3, and fb4, and the gate width is increased. That is, the gate width of each of the N-channel MOS transistors NM3 and NM4 is Wg5×4.

The intervals (p3) of the gates in the regions Rcm, Ra, and Rb are the same, and the intervals (p4) of the fins (fm1 to fm3, fa1, fa2, and fb1 to fb4) are also the same. Further, the widths of the fins (fm1 to fm3, fa1, fa2, and fb1 to fb4) are the same as described as Wg3. In this example, the numbers of fins are two (region Ra)<three (region Rmc)<four (region Rb). Preferably, the relations of (the number of fins in the region Ra)≤(the number of fins in the region Rmc)<(the number of fins in the region Rb) are preferable. The widths of the fins fm1 to fm3, fa1, fa2, and fb1 to fb4 in FIG. 14 are the same as described as Wg3.

As described above, the gate length Lg4 of each of the N-channel MOS transistors NM1 and NM2 is longer than the gate length Lg5 within the range that it does not exceed the interval p3 of the gates in the regions Rmc, Ra, and Rb (Lg4>Lg5). With the arrangement, the influence by the local manufacture variations in the N-channel MOS transistors NM1 and NM2 can be reduced. To further reduce the variations, transistors are coupled in multiple stages by using the two fins fa1 and fa2.

On the other hand, the N-channel MOS transistors NM3 and NM4 have a configuration that four pairs of transistors are coupled in parallel by using the four fins fb1, fb2, fb3, and fb4. By accordingly increasing the gate width of the N-channel MOS transistors NM3 and NM4, the shift speed of the match line ML[0] can be increased.

Figure 15:
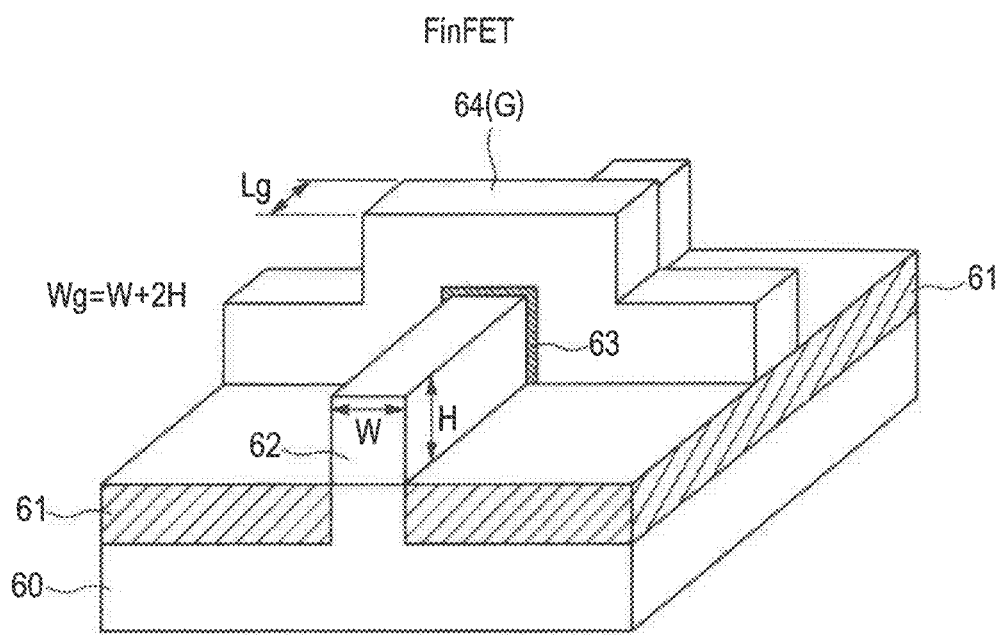
FIG. 15 is a diagram conceptually illustrating the structure of the Fin-type Transistor FinFET.

FIG. 15 is a diagram conceptually illustrating the structure of the Fin-type Transistor FinFET. With reference to FIG. 15, the configuration of the Fin-type transistor described with reference to FIG. 14 and the gate width and the gate length of the transistor will be described. The FinFET has, for example, a silicon substrate 60, an insulating film 61 formed over the silicon substrate 60, a fin 62 made of silicon which is formed over the silicon substrate 60 over which the insulating film 61 is not formed, a gate insulating film 63 formed on the top and side faces of the fin 62, and a gate (G) 64 formed by a polycrystalline silicon film extending so as to cover the gate insulating film 63. In the fin 62, the part covered with the gate insulating film 63 is the channel region of a Fin-type transistor FinFET, and the other parts are the source region and the drain region of the Fin-type transistor FinFET. The fin 62 is any of the fins fm1 to fm3, fa1, fa2, and fb1 to fb4 in FIG. 14. The gate length Lg of the FinFET is the width of the gate G. When the height of the fin 62 is H and the width of the fin 62 is W, the gate width Wg of the Fin transistor FinFET is expressed as Wg=W+2H. That is, the gate width Wg3 in FIG. 14 is illustrated in consideration of the heights and widths of the fins fm1 to fm3, fa1, fa2, and fb1 to fb4.

As illustrated in FIGS. 13 and 14, in the case of increasing the gate lengths of the N-channel MOS transistors NW1 and NW2 (refer to (a) in FIG. 8) which directly receive the match line ML [0] in order to reduce the influence of the manufacture variations, the gate capacity of the N-channel MOS transistors NM1 and NM2 increases. Consequently, the driving timing of the common coupling node MLB rather delays. It is therefore necessary to delay the shift timing from the low level to the high level of the second delay match output enable signal MAE2 or the driving timing accordingly. By adjusting the element layout of transistors used for the delay element DL1 (refer to (c) in FIG. 8) used to delay the second delay match output enable signal MAE2 to the element layout of the N-channel MOS transistors NM1 and NM2, the resistance to PVT (Process/Voltage/Temperature) variations can be improved.

Hereinafter, improvement in the resistance to the PVT variations will be described with reference to the drawings.

Figure 16:
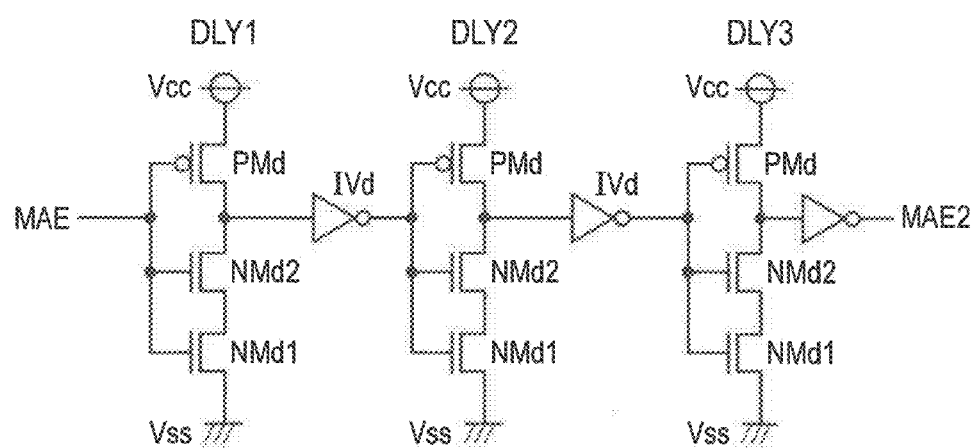
FIG. 16 is a circuit diagram of a delay element DL1 in FIG. 8.
Figure 17:
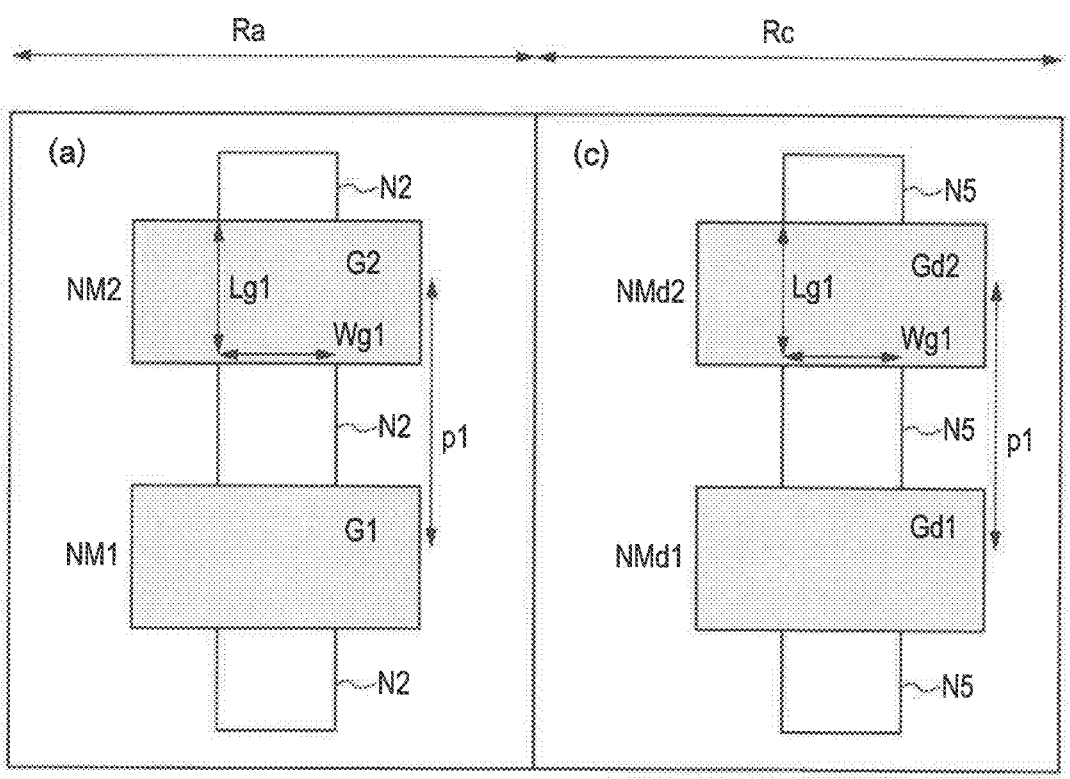
FIG. 17 is a diagram illustrating the layout of a delay element.

FIG. 16 is a circuit diagram of the delay element DL1 in FIG. 8. FIG. 17 is a diagram illustrating the layout of a delay element.

As illustrated in FIG. 16, in this example, the delay element DL1 is included by three delay stages DLY1 to DLY3. Each of the delay stages DLY1 to DLY3 includes a P-channel MOS transistor PMd, N-channel MOS transistors NMd1 and NMd2, and an inverter circuit IVd. The source-drain path of the P-channel MOS transistor PMd and the N-channel MOS transistors NMd1 and NMd2 is coupled in series between the first power supply potential Vcc and the second power supply potential Vss, and their gates are commonly coupled. The common coupling node of the P-channel MOS transistor PMd and the N-channel MOS transistor NMd2 is coupled to the input of the inverter circuit IVd. In each of the delay stages DLY1 to DLY3, a main signal is delayed by the N-channel MOS transistors NMd1 and NMd2.

FIG. 17 illustrates an element layout of the region Ra as the formation region of the N-channel MOS transistors NM1 and NM2 and the region Rc as the formation region of the N-channel MOS transistors NMd1 and NMd2. The region Ra is illustrated by extracting a part of the region Ra in FIG. 13. Consequently, the detailed description will not be repeated.

In the region Rc, gates Gd1 and Gd2 of the N-channel MOS transistors NMd1 and NMd2 and the N-type impurity layer pattern N5 are drawn.

As understood from FIG. 17, the gate length Lg1 and the gate width Wg1 of each of the N-channel MOS transistors NMd1 and NMd2 are the same as those of the N-channel MOS transistors NM1 and NM2. The interval (p1) of the gates is also the same.

With the configuration, degradation of the operation margin of the TCAM macro cell 10 caused by global variations in the change timing of the second delay match output enable signal MAE2 can be lessened. That is, the operation margin of the search operation can be improved.

The N-channel MOS transistors NMd1 and NMd2 can be configured by Fin-type transistors FinFET as described with reference to FIG. 14. In this case, the gate patterns and the number of fins of the N-channel MOS transistors NMd1 and NMd2 are set to the same as the gate patterns G1 and G2 and the fins fa1 and fa2 of the N-channel MOS transistors NM1 and NM2 illustrated in the region Ra in FIG. 14.

Modification 1

Figure 18:
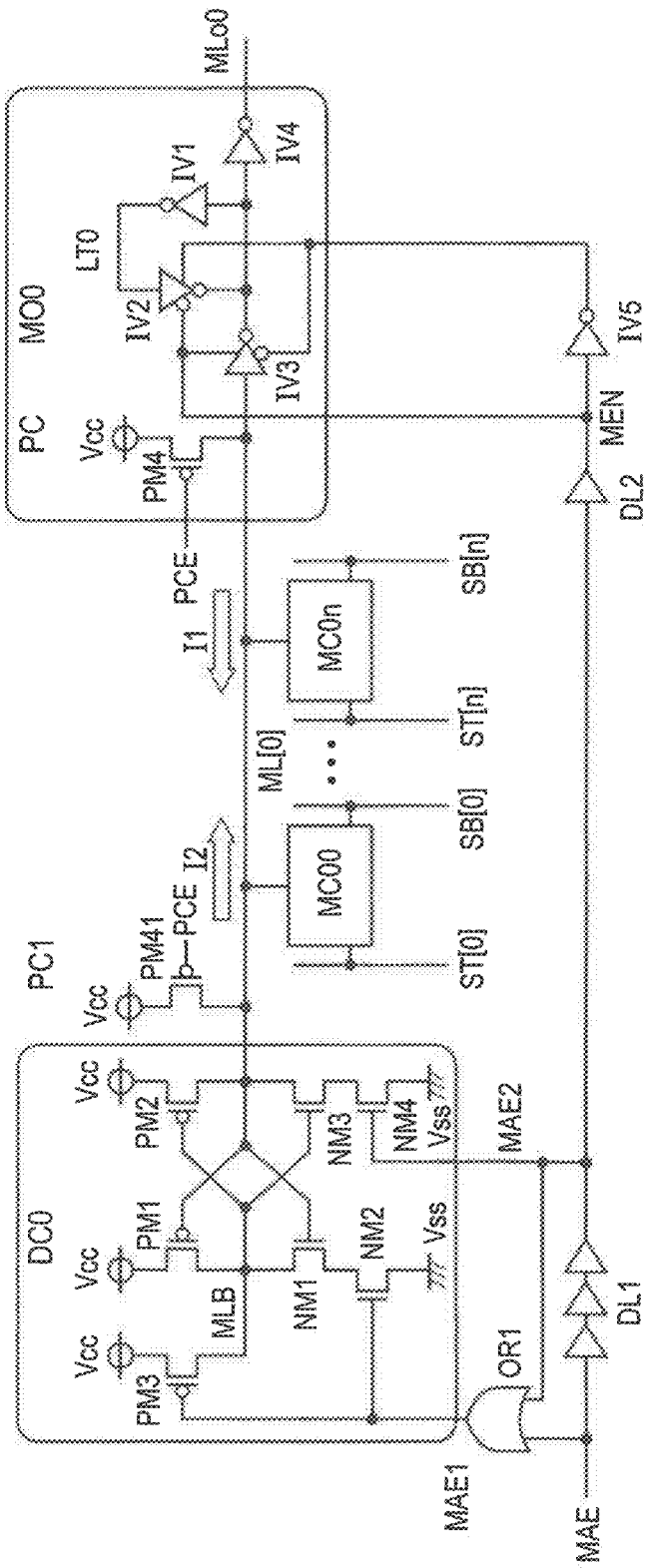
FIG. 18 is a diagram illustrating a circuit example corresponding to one entry of a TCAM macro cell according to a modification.

FIG. 18 is a diagram illustrating a circuit example corresponding to one entry of a TCAM macro cell according to a modification. A TCAM macro cell 10a illustrated in FIG. 18 has a configuration obtained by adding a pre-charge circuit (second pre-charge circuit) PC1 to the TCAM macro cell 10 in FIG. 8. The configuration and operation of the pre-charge circuit PC1 are the same as those of the pre-charge circuit (first pre-charge circuit) PC. The configuration other than the pre-charge circuit PC1 is the same as that of FIG. 8. The matters described in the example can be applied to the case of FIG. 18.

The added pre-charge circuit PC1 is arranged in the match line ML[0] near the potential changing circuit DC0. The pre-charge circuit PC is arranged in the match line ML[0] near the match line output circuit MO0. Therefore, the match line ML[0] is pre-charged from both sides by the pre-charge circuits PC and PC1.

Specifically, the pre-charge circuit PC1 is coupled at one end of the match line ML[0] and pre-charges the match line ML[0] from the one end side of the match line ML[0] to the pre-charge potential such as the high level. On the other hand, the pre-charge circuit PC is coupled at the other end side of the match line ML[0] and pre-charges the match line ML[0] from the other end side of the match line ML[0] to the pre-charge potential such as the high level. That is, the flow direction of the pre-charge current I1 by the pre-charge circuit PC and the flow direction of the pre-charge current I2 by the pre-charge circuit PC1 are opposite to each other.

In wiring electromigration (EM), by making current flow not only in one direction but also in the other direction, moved metal returns to the original position and EM resistance improves. In the TCAM macro cell 10a, when the memory cell MC driving the match line ML is in a place far from the pre-charge circuit, the current path becomes only in one direction, so that EM resistance cannot be improved. To solve it, the pre-charge circuits (PC and PC1) are coupled at both ends of the match line ML. With the configuration, the EM resistance of the TCAM macro cell improves.

Also in a configuration obtained by eliminating the potential changing circuit DC0 from the configuration of FIG. 18, the effect in the case of coupling the pre-charge circuits (PC and PC1) at both ends of the match line ML can be obtained.

Application Example

Figure 19:
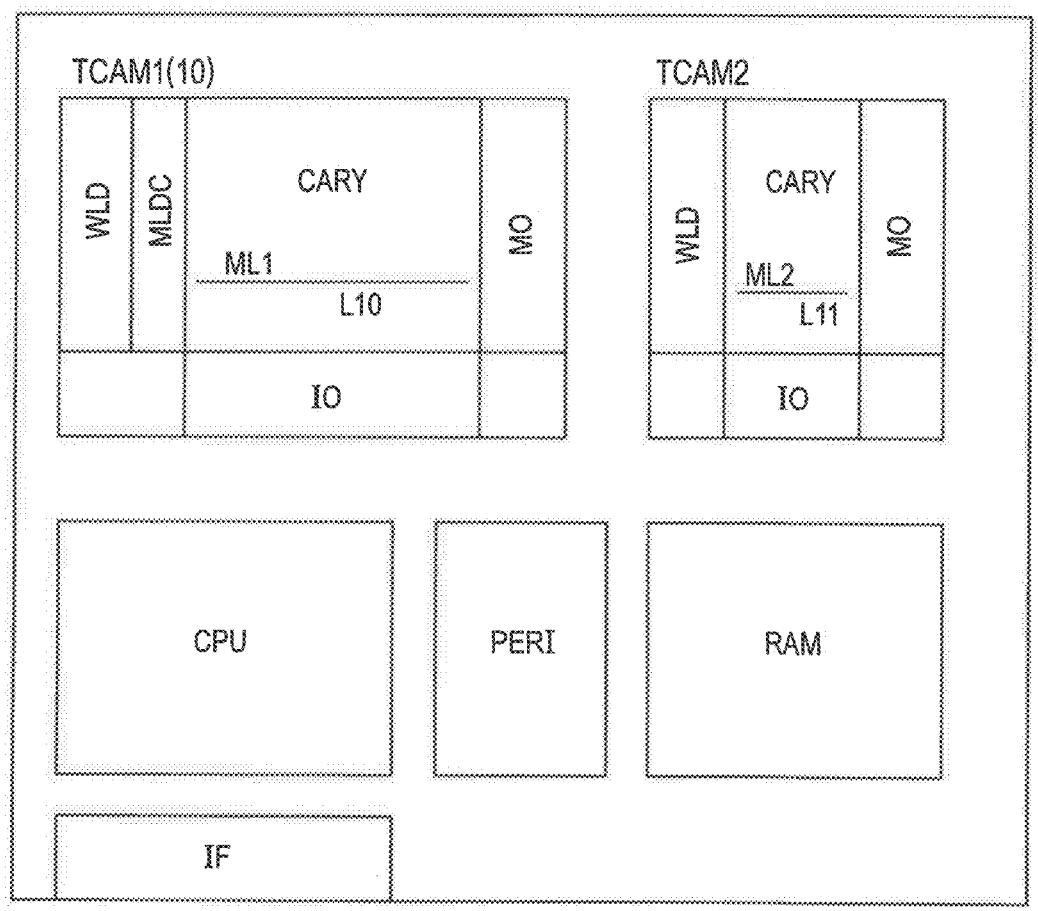
FIG. 19 is a schematic block diagram of a semiconductor device according to an application example.

FIG. 19 is a schematic block diagram of a semiconductor device according to an application example.

A semiconductor device IC has two TCAM macro cells TCAM1 and TCAM2. The semiconductor device IC also includes a central processing unit CPU, a peripheral circuit PERI, a memory device RAM, and an input/output interface IF.

The TCAM micro cell TCAM1 is the TCAM macro cell 10 (or 10a) described with reference to FIGS. 3 to 18. That is, the TCAM macro cell 10 has the match line potential changing circuit unit (MLDC) 26. On the other hand, the TCAM macro cell TCAM2 is a TCAM macro cell which does not have the match line potential changing circuit unit (MLDC) 26 as described with reference to FIG. 1. For example, the TCAM macro cell TCAM2 can be configured by eliminating the match line potential changing circuit unit (MLDC) 26 and the potential changing circuit DC0 in FIGS. 3, 7, and 8.

The length of the match line ML included in the TCAM macro cell TCAM1 and that in the TCAM macro cell TCAM2 are different. The length L10 of the match line ML1 included in the TCAM macro cell TCAM1 is longer than the length L11 of the match line ML2 included in the TCAM macro cell TCAM2 (L10>L11).

When a plurality of built-in TCAM macro cells are mounted in the semiconductor device IC, generally, the bit width (the number of bits of an entry) is not one kind. When the bit width (the number of bits of an entry) is small, the load capacity of the match line ML inevitably decreases, so that it is unnecessary to provide the match line potential changing circuit unit (MLDC) 26. In the application example, in a TCAM macro cell of a configuration in which the number of bits of an entry is large, the TCAM macro cell TCAM1 provided with the match line potential changing circuit unit (MLDC) 26 is employed. On the other hand, in a TCAM macro cell of a configuration in which the number of bits of an entry is small, the TCAM macro cell TCAM2 of a small-bit configuration which does not include the match line potential changing circuit unit (MLDC) 26 is employed. Therefore, by mixedly providing the TCAM macro cells TCAM1 and TCAM2 in the semiconductor device IC, the semiconductor device IC with low power consumption and smaller area can be realized.

Although the invention achieved by the inventors herein has been concretely described above on the basis of the embodiments, obviously, the invention is not limited to the embodiment and the example and can be variously modified.

What is claimed is:

1. A content addressable memory, comprising:
a plurality of memory cells;
a match line coupled to the plurality of memory cells;
a search line coupled to each of the plurality of memory cells;
a match line output circuit coupled to the match line; and
a potential changing circuit coupled to the match line and changing the potential of the match line,
wherein the potential changing circuit comprises:
a first P-channel MOS transistor including a gate coupled to the match line, a source supplied with a first reference potential, and a drain coupled to a common coupling node;
a first N-channel MOS transistor including a gate coupled to the match line and a drain coupled to the common coupling node;
a second N-channel MOS transistor including a drain coupled to a source of the first N-channel MOS transistor and a source supplied with a second reference potential lower than the first potential;
a second P-channel MOS transistor including a gate coupled to the common coupling node, a source supplied with the first reference potential, and a drain coupled to the match line;
a third N-channel MOS transistor including a gate coupled to the common coupling node and a drain coupled to the match line; and
a fourth N-channel MOS transistor including a drain coupled to a source of the third N-channel MOS transistor and a source supplied with the second potential.

2. The content addressable memory according to claim 1, wherein the plurality of memory cells are arranged between the potential changing circuit and the match line output circuit.

3. The content addressable memory according to claim 1, further comprising:
a word line coupled to each of the plurality of memory cells; and
a word line driver coupled to the word line,
wherein the potential changing circuit is provided between the word line driver and the plurality of memory cells.

4. The content addressable memory according to claim 1, wherein each of the plurality of memory cells comprises a Ternary Content Addressable Memory (TCAM) cell.

5. The content addressable memory according to claim 1, wherein a gate length of the first and second N-channel MOS transistors is longer than a gate length of the third and fourth N-channel MOS transistors.

6. The content addressable memory according to claim 1, wherein a gate width of the third and fourth N-channel MOS transistors is wider than a gate width of the first and second N-channel MOS transistors.

7. A semiconductor device, comprising:
a match line;
a plurality of memory cells coupled to the match line;
an output circuit coupled to the match line; and
a match line drawing amplification circuit coupled to the match line and for drawing the potential of the match line,
wherein the plurality of memory cells is arranged between the match line drawing amplification circuit and the output circuit, and
wherein the match line drawing amplification circuit comprises:
a first N-channel MOS transistor including a gate coupled to the match line and a drain coupled to the common coupling node;

a second N-channel MOS transistor including a drain coupled to a source of the first N-channel MOS transistor and a source supplied with a second reference potential lower than the first potential;

a second P-channel MOS transistor including a gate coupled to the common coupling node, a source supplied with the first reference potential, and a drain coupled to the match line;

a third N-channel MOS transistor including a gate coupled to the common coupling node and a drain coupled to the match line; and a fourth N-channel MOS transistor including a drain coupled to a source of the third N-channel MOS transistor and a source supplied with the second potential.

8. The semiconductor device according to claim 7, wherein a gate length of the first and second N-channel MOS transistors is longer than that of the third and fourth N-channel MOS transistors.

9. The semiconductor device according to claim 8, wherein the first, second, third, and fourth N-channel MOS transistors comprise FinFETs.

10. The semiconductor device according to claim 8, further comprising a delay element coupled to the gate of the fourth N-channel MOS transistor,
wherein the delay element includes fifth and sixth N-channel MOS transistors, and
wherein the gate length of the first and second N-channel MOS transistors is equal to the gate length of the fifth and sixth N-channel MOS transistors.

11. The semiconductor device according to claim 10, wherein the first, second, fifth, and sixth N-channel MOS transistors comprise FinFETs.

12. The semiconductor device according to claim 7, wherein a gate width of the third and fourth N-channel MOS transistors is wider than that of the first and second N-channel MOS transistors.

13. The semiconductor device according to claim 12, wherein the first, second, third, and fourth N-channel MOS transistors comprise FinFETs.

14. The semiconductor device according to claim 12, further comprising a delay element coupled to the gate of the fourth N-channel MOS transistor,
wherein the delay element includes fifth and sixth N-channel MOS transistors, and
wherein the gate width of the first and second N-channel MOS transistors is equal to the gate width of the fifth and sixth N-channel MOS transistors.

15. The semiconductor device according to claim 14, wherein the first, second, fifth, and sixth N-channel MOS transistors comprise FinFETs.

16. The semiconductor device according to claim 7, further comprising:
a first pre-charge circuit coupled to one end of the match line; and
a second pre-charge circuit coupled to the other end of the match line.

17. A semiconductor device comprising a first content addressable memory and a second content addressable memory,
wherein the first content addressable memory includes:
a plurality of first memory cells;
a first match line coupled to the plurality of first memory cells;
a first search line coupled to each of the plurality of first memory cells;
a first match line output circuit coupled to the first search line; and
a potential changing circuit coupled to the first search line and changing the potential of the first search line,
wherein the second content addressable memory includes:
a plurality of second memory cells;
a second match line coupled to the plurality of second memory cells;
a second search line coupled to each of the plurality of second memory cells; and
a second match line output circuit coupled to the second search line, and
wherein the potential changing circuit comprises:
a first P-channel MOS transistor including a gate coupled to the match line, a source supplied with a first reference potential, and a drain coupled to a common coupling node;
a first N-channel MOS transistor including a gate coupled to the match line and a drain coupled to the common coupling node;
a second N-channel MOS transistor including a drain coupled to a source of the first N-channel MOS transistor and a source supplied with a second reference potential lower than the first potential and;
a second P-channel MOS transistor including a gate coupled to the common coupling node, a source supplied with the first reference potential, and a drain coupled to the match line;
a third N-channel MOS transistor including a gate coupled to the common coupling node and a drain coupled to the match line; and
a fourth N-channel MOS transistor including a drain coupled to a source of the third N-channel MOS transistor and a source supplied with the second potential.

18. The semiconductor device according to claim 17, wherein the first match line is longer than the second match line.

19. The semiconductor device according to claim 17, wherein a gate length of the first and second N-channel MOS transistors is longer than a gate length of the third and fourth N-channel MOS transistors.

* * * * *